(12) United States Patent
Bristol et al.

(10) Patent No.: US 11,315,798 B2
(45) Date of Patent: Apr. 26, 2022

(54) TWO-STAGE BAKE PHOTORESIST WITH RELEASABLE QUENCHER

(71) Applicant: Intel Corporation, Santa Clara, CA (US)

(72) Inventors: Robert L. Bristol, Portland, OR (US); Marie Krysak, Portland, OR (US); James M. Blackwell, Portland, OR (US); Florian Gstrein, Portland, OR (US); Kent N. Frasure, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 330 days.

(21) Appl. No.: 16/075,555

(22) PCT Filed: Apr. 8, 2016

(86) PCT No.: PCT/US2016/026599
§ 371 (c)(1),
(2) Date: Aug. 3, 2018

(87) PCT Pub. No.: WO2017/176282
PCT Pub. Date: Oct. 12, 2017

(65) Prior Publication Data
US 2019/0043731 A1   Feb. 7, 2019

(51) Int. Cl.
| | | |
|---|---|---|
| *G03F 7/039* | (2006.01) | |
| *H01L 21/311* | (2006.01) | |
| *G03F 7/004* | (2006.01) | |
| *G03F 7/20* | (2006.01) | |
| *G03F 7/38* | (2006.01) | |
| *H01L 21/027* | (2006.01) | |
| *H01L 21/033* | (2006.01) | |
| *H01L 21/768* | (2006.01) | |

(52) U.S. Cl.
CPC ...... *H01L 21/31144* (2013.01); *G03F 7/0045* (2013.01); *G03F 7/0392* (2013.01); *G03F 7/203* (2013.01); *G03F 7/38* (2013.01); *H01L 21/0273* (2013.01); *H01L 21/0337* (2013.01); *H01L 21/76801* (2013.01); *H01L 21/76808* (2013.01); *H01L 21/76816* (2013.01)

(58) Field of Classification Search
CPC .... G03F 7/0045; G03F 7/0392; G03F 7/0757; G03F 7/0758
See application file for complete search history.

(56) References Cited

U.S. PATENT DOCUMENTS

| | | | |
|---|---|---|---|
| 5,658,711 | A | 8/1997 | Matsuo et al. |
| 6,395,451 | B1 | 5/2002 | Jung et al. |
| 2009/0142715 | A1 | 6/2009 | Araki et al. |
| 2011/0070542 | A1* | 3/2011 | Wang ............... G03F 7/0382 430/270.1 |
| 2012/0141938 | A1* | 6/2012 | Hatakeyama ....... C07D 239/28 430/283.1 |
| 2014/0356785 | A1 | 12/2014 | Williams, III et al. |
| 2015/0232596 | A1* | 8/2015 | Fornof ............... C08F 220/68 428/355 AC |

FOREIGN PATENT DOCUMENTS

| | | |
|---|---|---|
| JP | 2000-035672 | 2/2000 |
| KR | 10-2001-0028348 | 4/2001 |

OTHER PUBLICATIONS

International Search Report and Written Opinion for International Patent Application No. PCT/US2016/026599 dated Jan. 6, 2017, 9 pgs.

* cited by examiner

*Primary Examiner* — Daborah Chacko-Davis
(74) *Attorney, Agent, or Firm* — Schwabe, Williamson & Wyatt, P.C.

(57) ABSTRACT

Two-stage bake photoresists with releasable quenchers for fabricating back end of line (BEOL) interconnects are described. In an example, a photolyzable composition includes an acid-deprotectable photoresist material having substantial transparency at a wavelength, a photo-acid-generating (PAG) component having substantial transparency at the wavelength, and a base-generating component having substantial absorptivity at the wavelength.

11 Claims, 14 Drawing Sheets

CROSS-SECTIONAL VIEWS    PLAN VIEWS

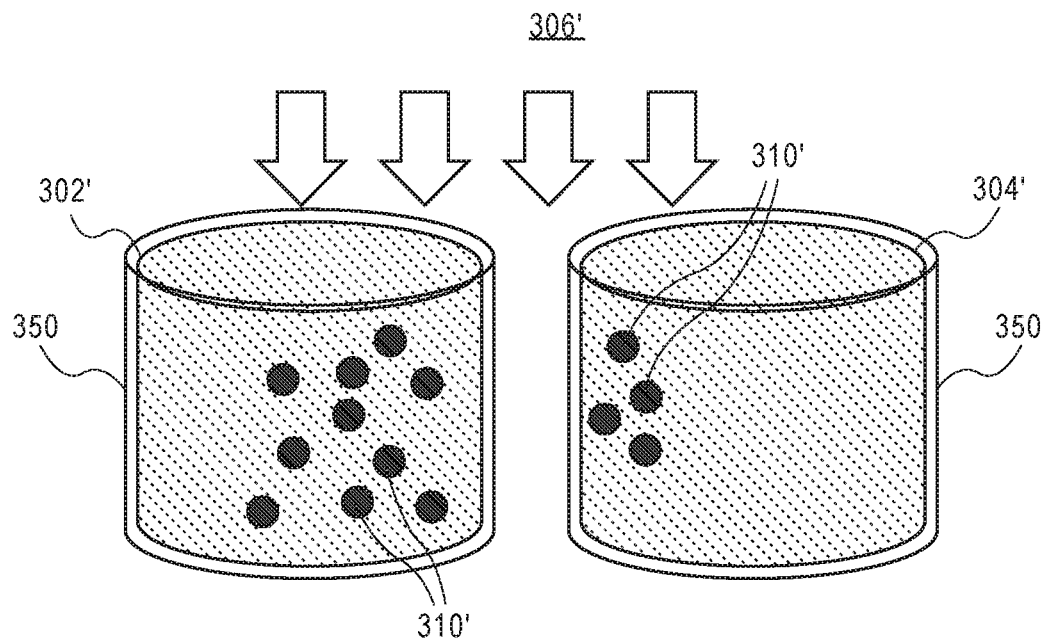
FIG. 3A'
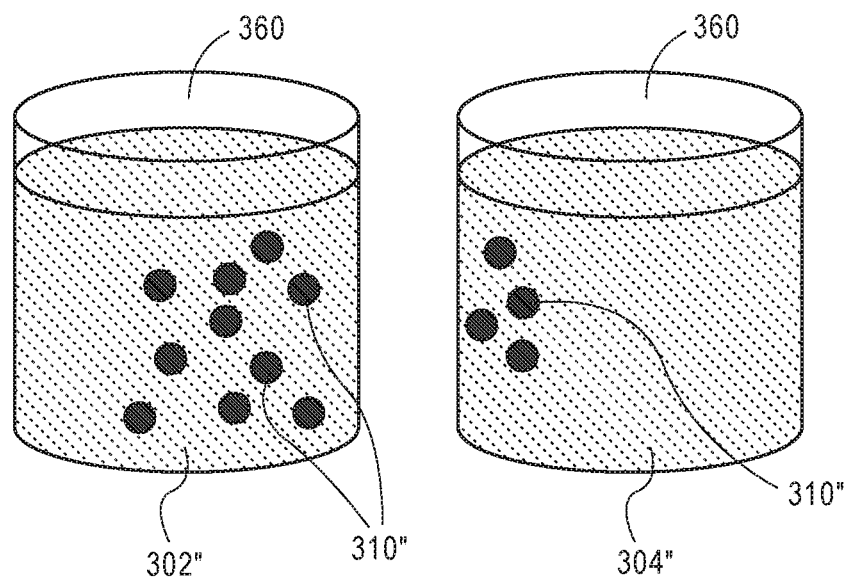
FIG. 3A"

TWO-STAGE BAKE PHOTORESIST WITH RELEASABLE QUENCHER

CROSS-REFERENCE TO RELATED APPLICATION

This patent application is a U.S. National Phase Application under 35 U.S.C. § 371 of International Application No. PCT/US2016/026599, filed Apr. 8, 2016, entitled "TWO-STAGE BAKE PHOTORESIST WITH RELEASABLE QUENCHER," which designates the United States of America, the entire disclosure of which is hereby incorporated by reference in its entirety and for all purposes.

TECHNICAL FIELD

Embodiments of the invention are in the field of semiconductor structures and processing and, in particular, two-stage bake photoresists with releasable quenchers for fabricating back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Alias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 3A' illustrates a schematic view of an operation in another method of patterning using photobuckets, in accordance with an embodiment of the present invention.

FIGS. 3A" illustrates a schematic view of an operation in another method of patterning using photobuckets, in accordance with an embodiment of the present invention.

FIG. 4A illustrates a cross-sectional view of a starting structure following deposition, but prior to patterning, of a hardmask material layer formed on an interlayer dielectric (ILD) layer;

FIG. 4B illustrates the structure of FIG. 4A following first time patterning of the first hardmask layer and subsequent first photobucket fill;

FIG. 4C illustrates the structure of FIG. 4B following second time patterning of the first hardmask layer and subsequent second photobucket fill;

FIG. 4D illustrates the structure of FIG. 4C following planarization to isolate the first and second photobuckets from one another;

FIG. 4E illustrates the structure of FIG. 4D following exposure and development of select photobuckets to leave select via locations;

FIG. 4F illustrates the structure of FIG. 4E following etching to form via locations;

FIG. 4G illustrates the structure of FIG. 4F following preparation for metal fill; and FIG. 4H illustrates the structure of FIG. 4G following metal fill.

FIG. 5A illustrates a starting point structure for a subtractive via process following deep metal line fabrication;

FIG. 5B illustrates the structure of FIG. 5A following recessing of the metal lines;

FIG. 5C illustrates the structure of FIG. 5B following formation of an inter layer dielectric (ILD) layer;

FIG. 5D illustrates the structure of FIG. 5C following deposition and patterning of a hardmask layer;

FIG. 5E illustrates the structure of FIG. 5D following trench formation defined using the pattern of the hardmask of FIG. 5D;

FIG. 5F illustrates the structure of FIG. 5E following photobucket formation by filling a two-stage bake photoresist with a releasable quencher in all possible via locations;

FIG. 5G illustrates the structure of FIG. 5F following via location selection;

FIG. 5H illustrates the structure of FIG. 5G following conversion of the remaining photobuckets to permanent ILD material; and FIG. 5I illustrates the structure of FIG. 5H following metal line and via formation.

DESCRIPTION OF THE EMBODIMENTS

Figure 1A:
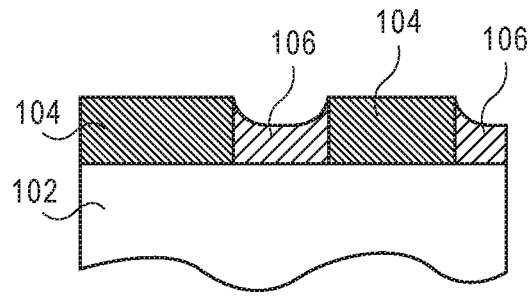
FIGS. 1A-1C illustrates cross-sectional views and corresponding plan views of various operations in a method of patterning using photobuckets including a two-stage bake photoresist, in accordance with an embodiment of the present invention.
Figure 1A:
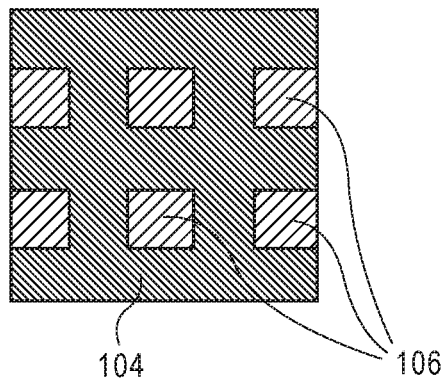

Two-stage bake photoresists with releasable quenchers for fabricating back end of line (BEOL) interconnects are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to two-stage bake photoresists with releasable quenchers. Applications may be directed toward one or more of extreme ultra-violet (EUV) lithography, general lithography applications, solutions for overlay issues, and general photoresist technologies. In an embodiment, materials are described that are suitable for improving performance of so-called "PhotoBucket" based approaches. In such an approach, a resist material is confined to a pre-patterned hardmask. Select ones of the photobuckets are then removed using a high-resolution lithography tool, e.g., an EUV lithography tool. Specific embodiments may be implemented to improve uniformity of the resist material response across a given photobucket.

To provide context, one goal in a photobucket approach may be the ability to first diffuse any EUV-released acids across an exposed photobucket to improve the uniformity of the resist response across the selected bucket. In past approaches, this has been achieved by the use of special materials which enable the acid to diffuse across the photobucket at a low enough temperature to avoid a solubility-switch reaction instigated from these acids. However, the action of another resist component, namely the quencher, may prevent such an advantage from being fully realized. In particular, the quencher may neutralize the acids before they are able to diffuse or spread across a given photobucket. Addressing such issues, in accordance with one or more embodiments described herein, a standard quencher is replaced with a quencher that can be released by an ultra-violet (UV) exposure or the like, providing the ability to avoid premature acid neutralization.

More particularly, in accordance with one or more embodiments described herein, a photobucket resist material including a UV-released quencher is implemented to effectively provide a "2-stage PEB" where the effect of EUV exposure is effectively averaged across a given photobucket. Such embodiments may enable a "digital" bucket response, in which the entire photobucket either clears out or does not. In specific embodiments, such a response is more tolerant to edge-placement errors, in which an aerial image does not perfectly align to the photobucket grid.

Figure 1B:
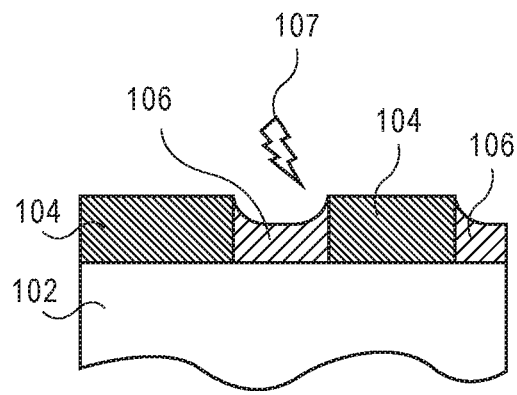
Figure 1B:
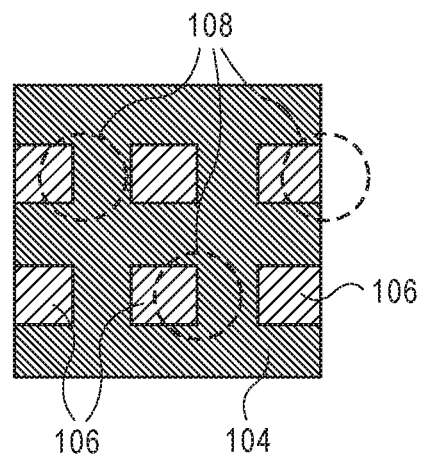
Figure 1C:
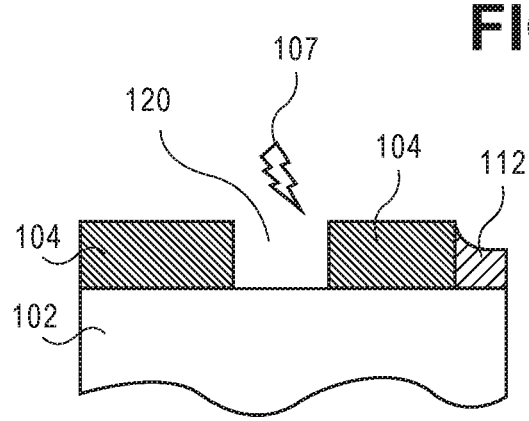
Figure 1C:
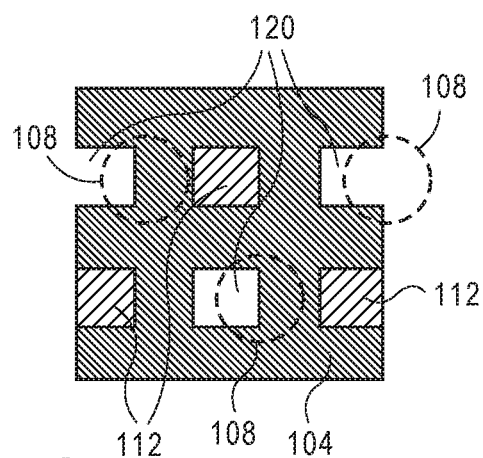

To exemplify one or more of the concepts involved herein, FIGS. 1A-1C illustrates cross-sectional views and corresponding plan views of various operations in a method of patterning using photobuckets including a two-stage bake photoresist, in accordance with an embodiment of the present invention.

Referring to FIG. 1A, a pre-patterned hardmask 104 is disposed above a substrate 102. The pre-patterned hardmask 104 has openings filled with a two-stage bake photoresist 106. The two-stage bake photoresist 106 is confined to the openings in the pre-patterned hardmask 104, e.g., to provide a grid of potential via locations.

Referring to FIG. 1B, select ones of the photobuckets are subjected to an exposure 107 from a lithography tool. The two-stage bake photoresist 106 is exposed with a lithography tool, e.g., an EUV lithography tool, to select which vias to open. In an embodiment, alignment between the lithography tool and the pre-patterned hardmask 104 grid is imperfect resulting in an asymmetry of exposure in the target bucket and/or partial exposure in the neighboring bucket. As seen in the plan view, the exposure 107 is a displaced aerial image 108.

Referring to FIG. 1C, although the exposure of FIG. 1B may have involved mis-alignment and partial exposure of non-selected photobuckets, only the selected photobuckets are cleared to form openings 120, leaving unselected photobuckets as closed photobuckets 112. In one embodiment, the process used to ensure only select photobuckets are ultimately opened, following exposure 107 of select regions of the two-stage bake photoresist 106, all of the two-stage bake photoresist 106 is first baked for acid diffusion. An ultra-violet (UV) quench release is then performed for acid neutralization. A second bake is then performed for a solubility switch, as described in greater detail below. In a specific embodiment, the photoacids released from the first bake operation are diffused throughout the photobucket. The UV flood exposure releases quenchers and then the final solubility-switch bake is performed. The process is elaborated below in association with FIGS. 3A-3E.

As a result, the select locations which receive a greater exposure are ultimately cleared to provide open photobucket locations 120 following development. The non-selected locations which receive no exposure, or only partial exposure but to a lesser extent in the case of mis-alignment, remain as closed photobucket locations 112 following development.

Figure 2:
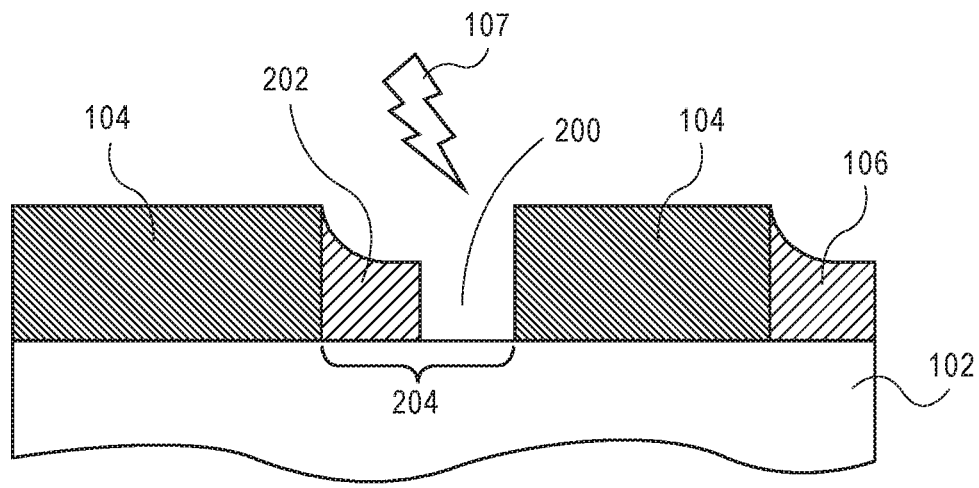
FIG. 2 illustrates a cross-sectional view of a conventional resist photobucket structure following photobucket development after a mis-aligned exposure.

To exemplify a contrasting scenario where a conventional photoresist is used, FIG. 2 illustrates a cross-sectional view of a conventional resist photobucket structure following photobucket development after a mis-aligned exposure. A photobucket region 204 is shown as only partially cleared 200 with some residual photoresist 202 remaining. In the case that the photobucket 204 is a selected photobucket, the misaligned exposure 107 only partially clears the photobucket, which may lead to subsequent poor quality fabrication of conductive structure in such locations. In the case that the photobucket 204 is a non-selected photobucket, some unwanted opening 200 occurs, potentially leading to subsequent formation of conductive structures in unwanted locations.

In a more detailed process description, FIGS. 3A-3E illustrates schematic views of various operations in a method of patterning using photobuckets including a two-stage bake photoresist, in accordance with an embodiment of the present invention.

Figure 3A:
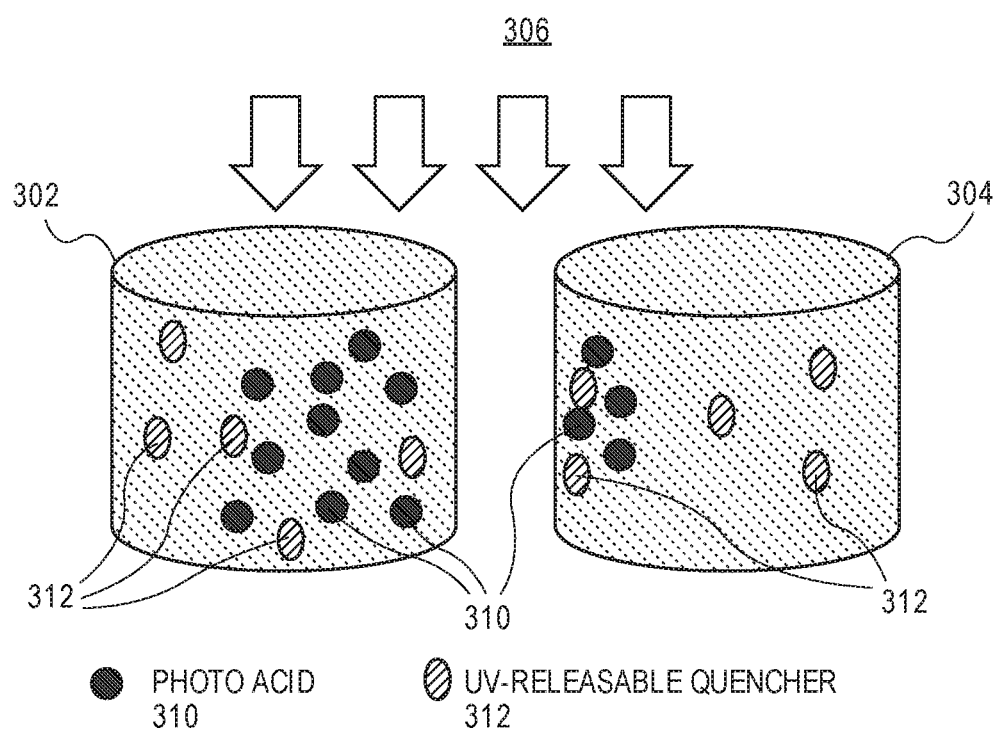
FIGS. 3A-3E illustrates schematic views of various operations in a method of patterning using photobuckets including a two-stage bake photoresist, in accordance with an embodiment of the present invention.

Referring to FIG. 3A, first 302 and second 304 photobuckets each include a photolyzable composition including an acid-deprotectable photoresist material, a photo-acid-generating (PAG) component 310, and a photo-base-generating component 312. A misaligned EUV or e-beam exposure 306 is performed on a selected photobucket 302 and a non-selected photobucket 304, which heavily exposes the selected photobucket 302 and partially exposes the non-selected photobucket 304 but to a lesser extent. In a specific embodiment, the photo-base-generating component 312 is a UV-releasable quencher.

Figure 3B:
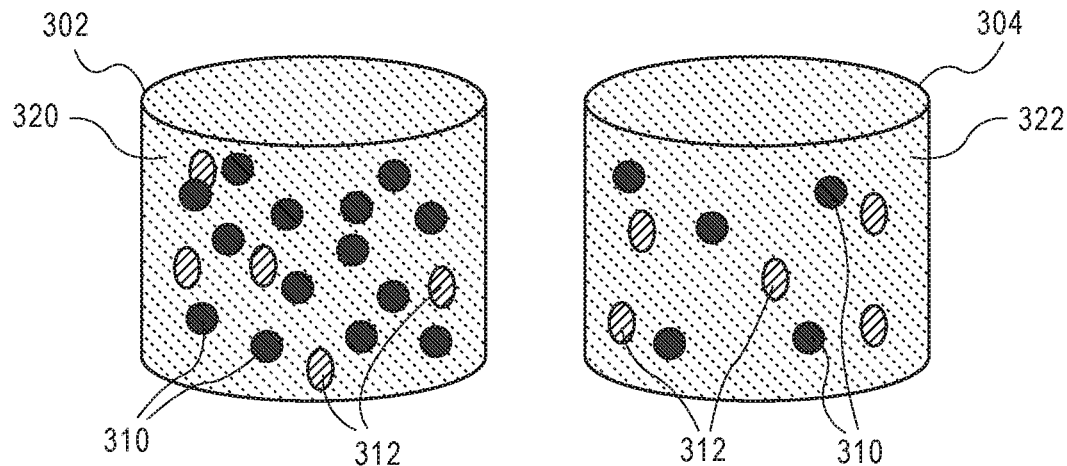

Referring to FIG. 3B, a first bake is performed. In one embodiment, the first bake is performed at a temperature too low to cause a solubility switch. In one such embodiment, the bake is a diffusion only bake leading to diffused materials 320 and 322 of photobuckets 302 and 304, respectively.

Figure 3C:
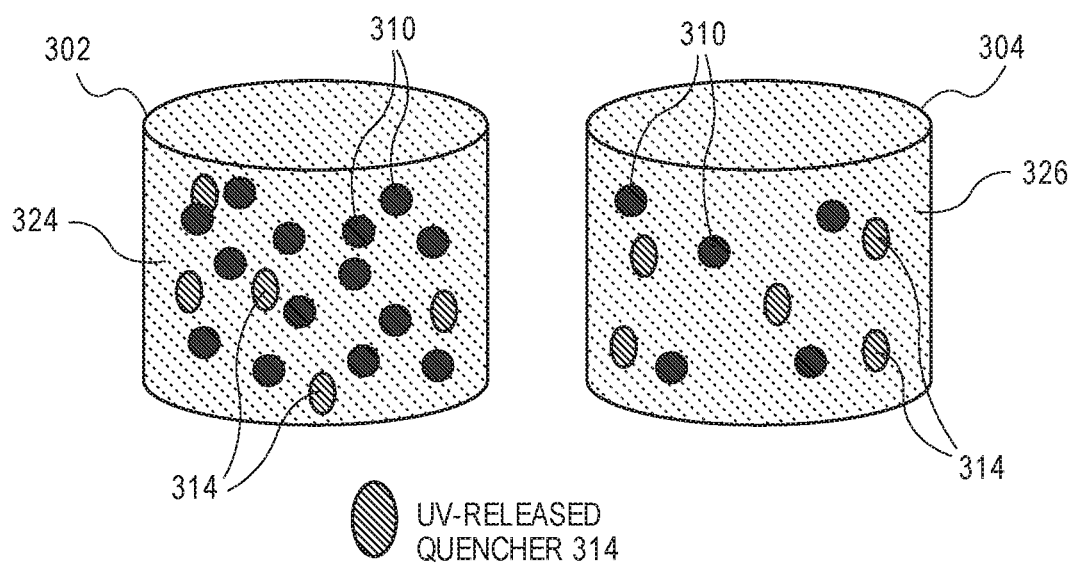

Referring to FIG. 3C, quenchers 314 are released to form materials 324 and 326 for photobuckets 302 and 304, respectively. In one embodiment, the quenchers 314 are UV-released quenchers. In a specific such embodiment, the UV-released quenchers are released by UV flood exposure, e.g., a 365 nm exposure. In an embodiment, the photobuckets 302 and 304 are both exposed to the flood exposure to the same extent.

Figure 3D:
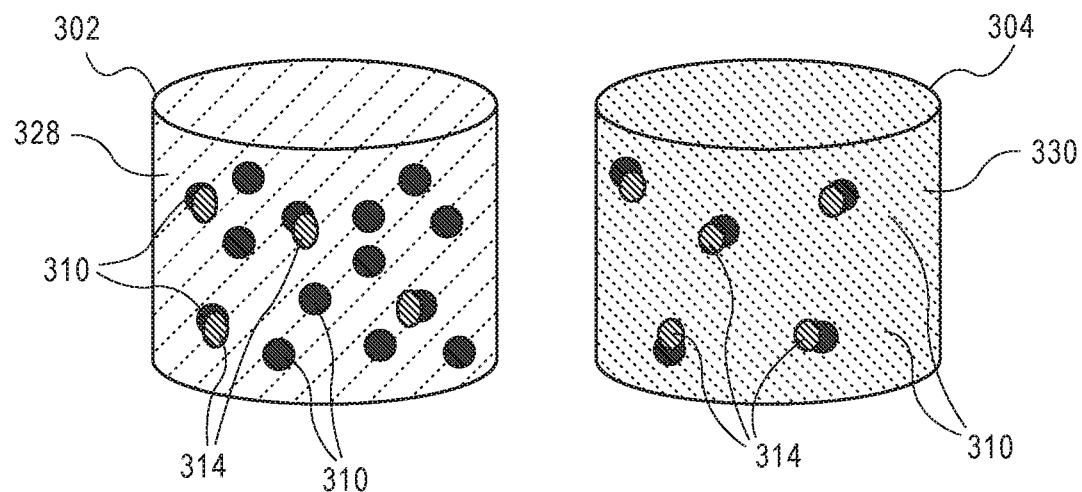

Referring to FIG. 3D, a second bake is performed to provide materials 328 and 330 of photobuckets 302 and 304, respectively. In an embodiment, the second bake is generates a solubility switch, in which a sub-critical acid concentration quenched. In this manner, there are essentially no local acid concentrations. That is, deprotection of part of an unintended only partially exposed photobucket does not occur.

Figure 3E:
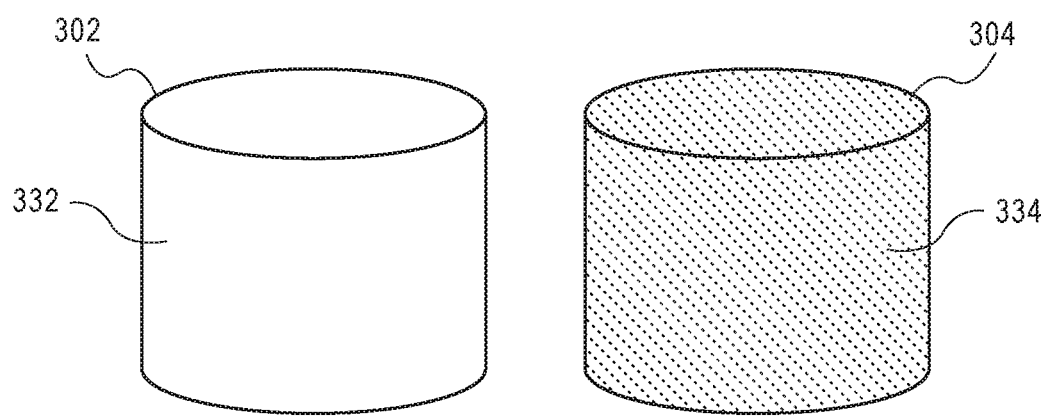

Referring to FIG. 3E, the photobuckets 302 and 304 are subjected to a development process. The selected photobucket 302 is cleared upon development to provide a cleared photobucket 332. The non-selected photobucket 304 is not cleared upon development and remains a blocked photobucket 334. In this way, even in the event of a mis-aligned exposure, a digital photobucket response (open or closed only, without partial open) is achieved.

It is to be appreciated that not all embodiments require a single composition to achieve a two-stage bake photoresist. In a first alternative example, FIGS. 3A' illustrates a schematic view of an operation in another method of patterning using photobuckets, in accordance with an embodiment of the present invention. Referring to FIG. 3A', first 302' and second 304' photobuckets each include a grafted photo-base-generating component 350 along a bottom and sidewalls of the first 302' and second 304' photobuckets. A photolyzable composition is formed within the grafted photo-base-generating component 350. The photolyzable composition includes an acid-deprotectable photoresist material and a photo-acid-generating (PAG) component 310'. An exposure 306' and multi-stage development process may then performed similar to the above described approaches.

In a second alternative example, FIGS. 3A" illustrates a schematic view of an operation in another method of patterning using photobuckets, in accordance with an embodiment of the present invention. Referring to FIG. 3A", first 302" and second 304" photobuckets each include a photolyzable composition including an acid-deprotectable photoresist material and a photo-acid-generating (PAG) component 310". Subsequent to performing a first bake, a layer 360 including a base-generating component is formed on the first 302" and second 304". The photobuckets 302" and 304" are then exposed to ultraviolet (UV) radiation. In this case, the base component does not need to be introduced via a photo-base generator, but may rather be deposited in a later process operation, e.g., by vapor deposition of a base layer or exposure to basic atmosphere NMP.

Applications of the above described photoresist compositions and approaches may be implemented for to create regular structures covering all possible via (or plug) locations, followed by selective patterning of only the desired features. To provide further material details, in an embodiment, referring again to FIGS. 3A-3E, photobuckets 302 and 304 include photolyzable composition. The photolyzable composition includes an acid-deprotectable photoresist material having substantial transparency at a wavelength. The photolyzable composition also includes a photo-acid-generating (PAG) component having substantial transparency at the wavelength. The photolyzable composition includes a base-generating component having substantial absorptivity at the wavelength. In alternative embodiments, the acid-deprotectable photoresist material is not substantially transparent at the wavelength.

In an embodiment, the base-generating component is one selected from the group consisting of a photo-base-generating component, an electron-base-generating component, a chemical-base-generating component, and a UV-base-generating component. In one embodiment, the base-generating component is a sonication-base-generating component. In an embodiment, the base-generating component is UV-absorbing. In an embodiment, the base-generating component includes a low-energy UV chromophore. In a specific such embodiment, the low-energy UV chromophore is selected from the group consisting of anthracenylcarbamates, naphthalenylcarbamates, 2-nitrophenylcarbamates, arylcarbamates, coumarins, phenylglyoxylic acid, substituted acetophenones and benzophenones. In one embodiment, the low-energy UV chromophore is a photo-released amine. In an embodiment, the base-generating component includes a material selected from the group consisting of N,N-dicyclohexyl-2-nitrophenylcarbamate, N,N-disubstituted carbamates and mono-substituted carbamates.

In an embodiment, the PAG component includes a material selected from the group consisting of triethyl, trimethyl and other trialkyl sulfonates, where the sulfonate group is selected from the group consisting of trifluoromethylsulfonate, nonanfluorobutanesulfonate, and p-tolylsulfonate, or other examples containing —SO3 sulfonate anion bound to organic group. In an embodiment, the acid-deprotectable photoresist material is an acid-deprotectable material selected from the group consisting of a polymer, a molecular glass, a carbosilane and a metal oxide. In one embodiment, a metal oxide is used and a release base is not needed. In an embodiment, the acid-deprotectable photoresist material includes a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking.

In an embodiment, the wavelength is approximately 365 nm. In an embodiment, the acid-deprotectable photoresist material is substantially absorbing at a wavelength of approximately 13.5 nanometers. In an embodiment, the acid-deprotectable photoresist material is substantially absorbing at an energy approximately in the range of 5-150 keV. In an embodiment, a molar ratio of the PAG component to the base-generating component is at least 50:1.

Referring again to FIGS. 3A-3E, 3A' and 3A", in accordance with an embodiment of the present invention, a method of selecting a photobucket for semiconductor processing includes providing a structure having a first photobucket 302 neighboring a second photobucket 304. The structure is exposed to extreme ultraviolet (EUV) or e-beam radiation 306, where the first photobucket 302 is exposed to the EUV or e-beam radiation 306 to a greater extent than the second photobucket 304. Subsequent to exposing the structure to EUV or e-beam radiation 306, a first bake of the first and second photobuckets is performed as is described in association with FIG. 3B. Subsequent to performing the first bake, the structure to ultraviolet (UV) radiation, where the first photobucket is exposed to the UV radiation to approximately the same extent as the second photobucket, as is described in association with FIG. 3C. Subsequent to exposing the structure to UV radiation, a second bake of the first and second photobuckets is performed as is described in association with FIG. 3D. Subsequent to performing the second bake, the structure is developed. The developing opens the first photobucket and leaves the second photobucket closed as is described in association with FIG. 3E.

In an embodiment, exposing the structure to extreme ultraviolet (EUV) or e-beam radiation includes exposing the structure to energy having a wavelength approximately 13.5 nanometers. In another embodiment, exposing the structure to extreme ultraviolet (EUV) or e-beam radiation includes exposing the structure to energy in the range of 5-150 keV, in an embodiment, exposing the structure to UV radiation includes exposing the structure to energy having a wavelength approximately 365 nanometers. In an embodiment, the first bake is performed at a temperature approximately in the range of 50-120 degrees Celsius for a duration of approximately in the range of 0.5-5 minutes. In an embodiment, the second bake is performed at a temperature approximately in the range of 100-180 degrees Celsius for a duration of approximately in the range of 0.5-5 minutes.

In an embodiment, referring specifically to FIG. 3A, the first and second photobuckets each include a photolyzable composition including an acid-deprotectable photoresist material, a photo-acid-generating (PAG) component, and a photo-base-generating component. In one such embodiment, exposing the structure to extreme ultraviolet (EUV) or e-beam radiation includes activating the PAG component. The first bake diffuses acid formed from activating the RAG component throughout the first and second photobuckets. Exposing the structure to UV radiation includes activating the photo-base-generating component. The second bake quenches a total amount of acid formed in the second photobucket with base generated front the photo-base-generating component but does not quench a total amount of acid formed in the first photobucket.

In another embodiment, referring specifically to FIG. 3A', the first and second photobuckets each include a grafted photo-base-generating component along a bottom and sidewalk of the first and second photobuckets and a photolyzable composition formed within the grafted photo-base-generating component. The photolyzable composition includes an acid-deprotectable photoresist material and a photo-acid-generating (PAG) component. In one such embodiment, exposing the structure to extreme ultraviolet (EUV) or e-beam radiation includes activating the PAG component. The first bake diffuses acid formed from activating the PAG component throughout the first and second photobuckets. Exposing the structure to UV radiation includes activating the grafted photo-base-generating component. The second bake quenches a total amount of acid formed in the second photobucket with base generated from the photo-base-generating component but does not quench a total amount of acid formed in the first photobucket.

In another embodiment, referring specifically to FIG. 3A", the first and second photobuckets each include a photolyzable composition including an acid-deprotectable photoresist material and a photo-acid-generating (PAG) component. The method further includes, subsequent to performing the first bake and prior to exposing the structure to ultraviolet (UV) radiation, forming a layer including a base-generating component on the first and second photobuckets. In one such embodiment, exposing the structure to extreme ultraviolet (EUV) or e-beam radiation includes activating the PAG component. The first bake diffuses acid formed from activating the PAG component throughout the first and second photobuckets. Exposing the structure to UV radiation includes activating the base-generating component. The second bake quenches a total amount of acid formed in the second photobucket with base generated from the base-generating component but does not quench a total amount of acid formed in the first photobucket.

In any of the above described cases, in an embodiment, developing the structure includes, in the case of positive tone development, immersion or coating with standard aqueous TMAH developer (e.g., in a concentration range from 0.1 M-1 M) or other aqueous or alcoholic developer based on tetraalkylammonium hydroxides for 30-120 seconds followed by rinse with DI water. In another embodiment, in the case of negative tone development, developing the structure includes immersion or coating with organic solvents such as cyclohexanone, 2-heptanone, propylene glycol methylethyl acetate or others followed by rinse with another organic solvent such as hexane, heptane, cyclohexane or the like.

In an exemplary embodiment, approaches described above build on approaches using so-called "photobuckets," in which every possible feature, e.g. via, is pre-patterned into a substrate. Then, a photoresist is filled into patterned features and the lithography operation is merely used to choose select vias for via opening formation. In a particular embodiment described below, a lithography operation is used to define a relatively large hole above a plurality of photobuckets that include a two-stage bake photoresist, as described above. The two-stage bake photoresist photobucket approach allows for larger critical dimensions (CD)s and/or errors in overlay while retaining the ability to choose the via of interest.

To provide further context, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned plugs and/or vias, greatly simplifying the web of overlay errors, and leaving only one critical overlay step (Mx+1 grating). In an embodiment, then, offset due to conventional lithograph/dual damascene patterning that must otherwise be tolerated, is not a factor for the resulting structures described herein.

In general, one or more embodiments are directed to an approach that employs a subtractive technique to ultimately form conductive vias and, possibly, non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

More specifically, one or more embodiment described herein involves the use of a subtractive method to pre-form every via or via opening using the trenches already etched. An additional operation is then used to select which of the vias and plugs to retain. Such operations can be illustrated using "photobuckets," although the selection process may also be performed using a more conventional resist expose and ILD backfill approach.

In one aspect, a self-aligned via opening approach is used. As an example, FIGS. 4A-4H illustrate portions of integrated circuit layers representing various operations in a method of subtractive self-aligned via patterning using photobuckets including a two-stage bake photoresist, in accordance with an embodiment of the present invention. In each illustration at each described operation, cross-sectional views are shown.

Figure 4A:
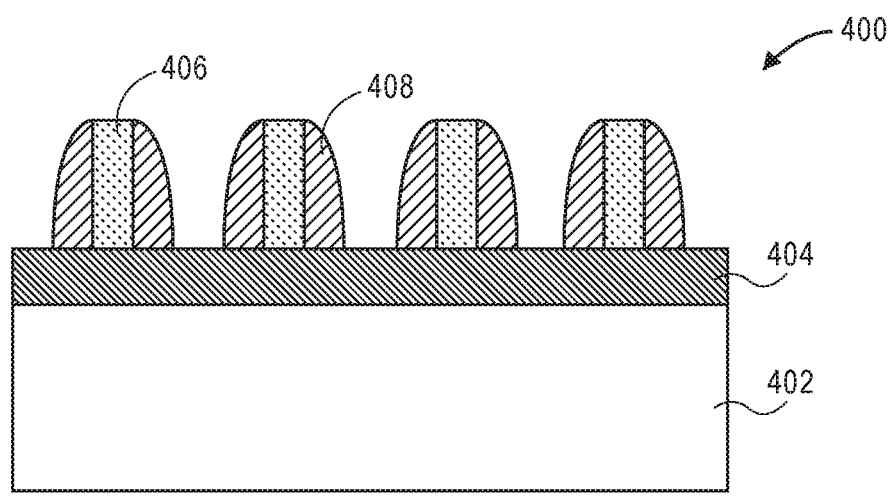
FIGS. 4A-4H illustrate portions of integrated circuit layers representing various operations in a method of subtractive self-aligned via patterning using photobuckets including a two-stage bake photoresist, in accordance with an embodiment of the present invention, where.

FIG. 4A illustrates a cross-sectional view of a starting structure 400 following deposition, but prior to patterning, of a first hardmask material layer 404 formed on an interlayer dielectric (ILD) layer 402, in accordance with an embodiment of the present invention. Referring to FIG. 4A, a patterned mask 406 has spacers 408 formed along sidewalls thereof, on or above the first hardmask material layer 404.

Figure 4B:
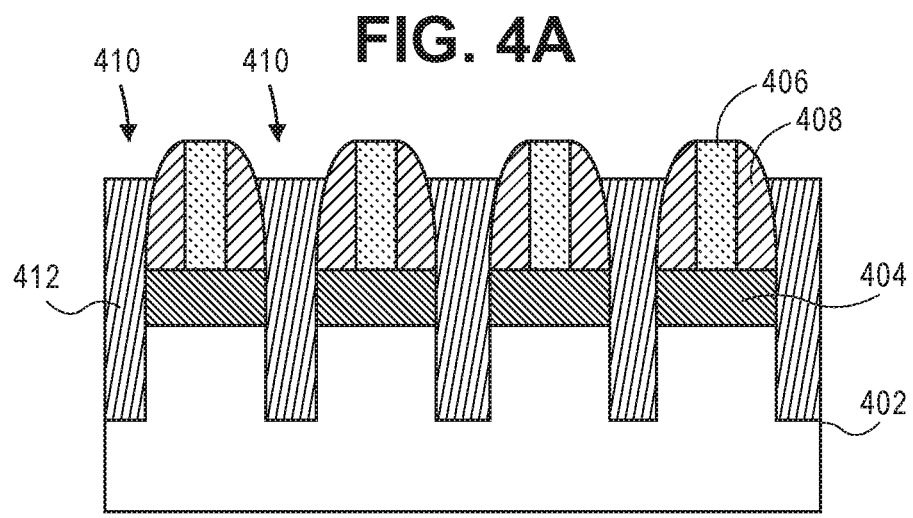

FIG. 4B illustrates the structure of FIG. 4A following first time patterning of the first hardmask layer and subsequent first photobucket fill, in accordance with an embodiment of the present invention. Referring to FIG. 4B, the patterned mask 406 and corresponding spacers 408 are used together as a mask during an etch to form trenches 410 through the first hardmask material layer 404 and partially into the ILD layer 402. The trenches 410 are then filled with first photobuckets 412 which include a two-stage bake photoresist.

Figure 4C:
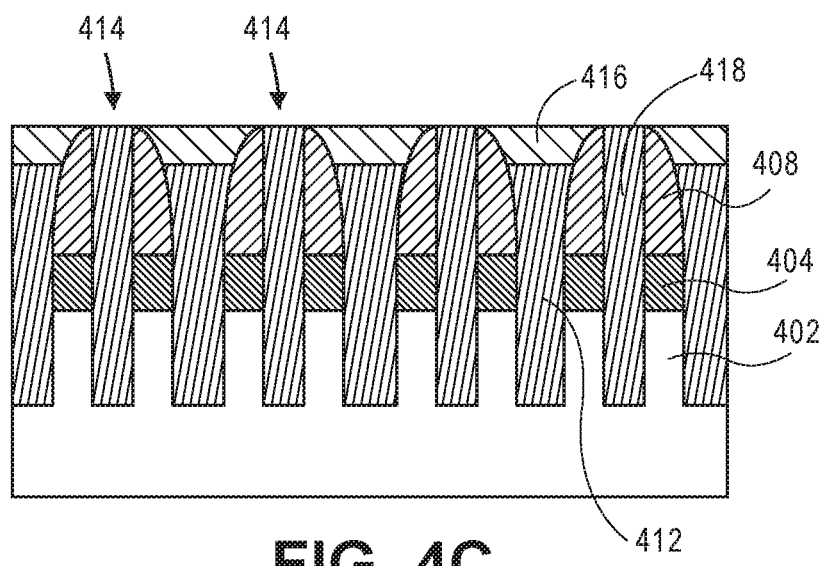

FIG. 4C illustrates the structure of FIG. 4B following second time patterning of the first hardmask layer and subsequent second photobucket fill, in accordance with an embodiment of the present invention. Referring to FIG. 4C, the patterned mask 406 is removed and a second plurality of trenches 414 is etched through the first hardmask material layer 404 and partially into the ILD layer 402, between spacers 408. Subsequently, the trenches 414 are filled with second photobuckets 418 which include a two-stage bake photoresist. In one such embodiment, the second photobuckets 418 and the first photobuckets 412 are filled with a same two-stage bake photoresist material.

Referring again to FIG. 4C, the negative pattern of the spacers 408 is thus transferred, e.g., by two etch processes forming trenches 410 and 414, to the first hardmask material layer 404. In one such embodiment, the spacers 408 and, hence, the trenches 410 and 414 are formed with a grating pattern, as is depicted in FIG. 4C. In an embodiment, the grating pattern is a tight pitch grating pattern. In a specific such embodiment, the tight pitch is not achievable directly through conventional lithography. For example, a pattern based on conventional lithography may first be limited to mask 406, but the pitch may be halved by the use of negative spacer mask patterning, as is depicted in FIGS. 4A-4C. Even further, although not shown, the original pitch may be quartered by a second round of spacer mask patterning. Accordingly, the grating-like pattern of the photobuckets 412 and 418, collectively, is spaced at a constant pitch and has a constant width.

Figure 4D:
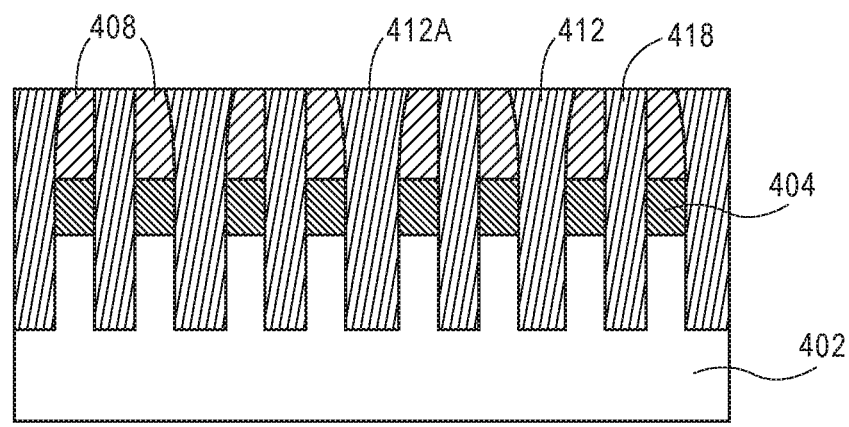

FIG. 4D illustrates the structure of FIG. 4C following planarization to isolate the first and second photobuckets from one another, in accordance with an embodiment of the present invention. Referring to FIG. 4D, the second photobuckets 418 and the top portions of the spacers 408 are planarized, e.g., by chemical mechanical polishing (CMP), until the top surfaces of the first photobuckets 412 are exposed, forming discrete second photobuckets 418. In one embodiment, the combination of first photobuckets 412 and second photobuckets 418 represent all possible via locations in a subsequently formed metallization structure. One of the first photobuckets 412 is labeled as 412A to indicate that it is selected from removal for ultimate via fabrication.

Figure 4E:
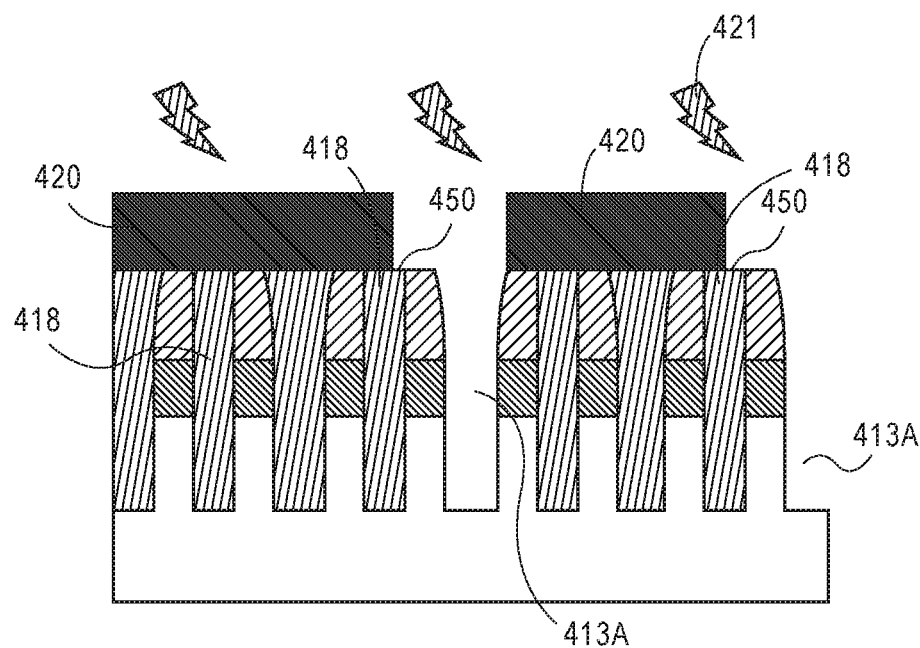

FIG. 4E illustrates the structure of FIG. 4D following exposure and development of two photobuckets to leave selected via locations, in accordance with an embodiment of the present invention. Referring to FIG. 4E, a second hardmask 420 is formed and patterned on the structure of FIG. 4D. The patterned second hardmask 420 reveals two of the first photobuckets 412. The selected photobuckets are exposed to light irradiation, such as an EUV or e-beam exposure 421. It is to be appreciated that description herein concerning forming and patterning a hardmask layer involves, in an embodiment, mask formation above a blanket hardmask layer. The mask formation may involve use of one or more layers suitable for lithographic processing. Upon patterning the one or more lithographic layers, the pattern is transferred to the hardmask layer by an etch process to provide a patterned hardmask layer.

In accordance with one embodiment, referring again to FIG. 4E, neighboring one of the second photobuckets 418 are partially exposed, e.g., due to mis-alignment in the patterning of second hardmask 420. In particular, two of the second photobuckets 418 are inadvertently exposed at regions 450, even though they have not been selected as locations for via fabrication. Thus, the selected ones of the first photobuckets 412 are exposed to the EUV or e-beam radiation to a greater extent than the neighboring partially exposed ones of the second photobuckets 418. Subsequent to exposing the structure to EUV or e-beam radiation 421, a first bake of the photobuckets is performed. Subsequent to performing the first bake, the structure is exposed to ultraviolet (UV) radiation. In one embodiment, the mask 420 remains during the UV radiation and is then subsequently removed. However, in another embodiment, the mask 420 is first removed and the photobuckets are then all exposed to the UV radiation to approximately the same extent. In either case, subsequent to exposing the structure to UV radiation, a second bake of the photobuckets is performed.

Referring again to FIG. 4E, the photobuckets are subjected to a develop process. During the develop process, the select one of the first photobuckets 412 targeted for via fabrication are emptied in that the photoresist is removable. However, locations not selected for via fabrication, including the ones of the second photobuckets 418 that were partially exposed at regions 450, are not opened during the develop process, in that the resist material is not removable in the develop process. The developing provides selected via openings 413A.

Figure 4F:
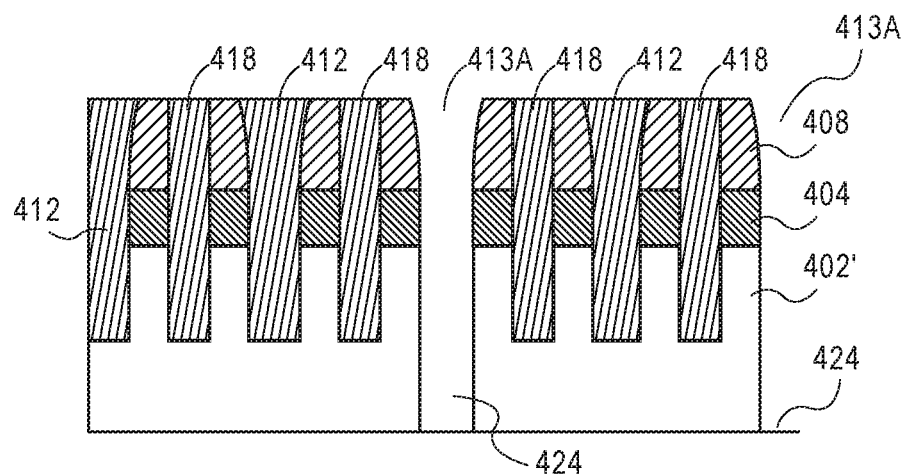

FIG. 4F illustrates the structure of FIG. 4E following etching to form via locations, in accordance with an embodiment of the present invention. Referring to FIG. 4F, the pattern of the via openings 413A are subjected to a selective etch process, such as a selective plasma etch process, to extend the via openings deeper into the underlying ILD layer 402, forming via patterned ILD layer 402' with via locations 424. The etching is selective to remaining photobuckets 412 and 418 and to the spacers 408.

Figure 4G:
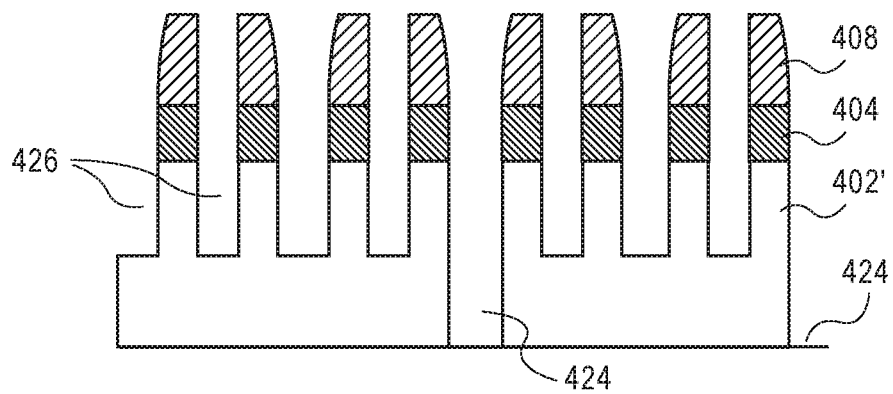

FIG. 4G illustrates the structure of FIG. 4F in preparation for metal fill, in accordance with an embodiment of the present invention. Referring to FIG. 4G, all remaining first and second photobuckets 412 and 418 are removed. The remaining first and second photobuckets 412 and 418 may be removed directly, or may first be exposed and developed to enable removal. The removal of the remaining first and second photobuckets 412 and 418 provides metal line trenches 426, some of which are coupled to via locations 424 in patterned ILD layer 402'.

Figure 4H:
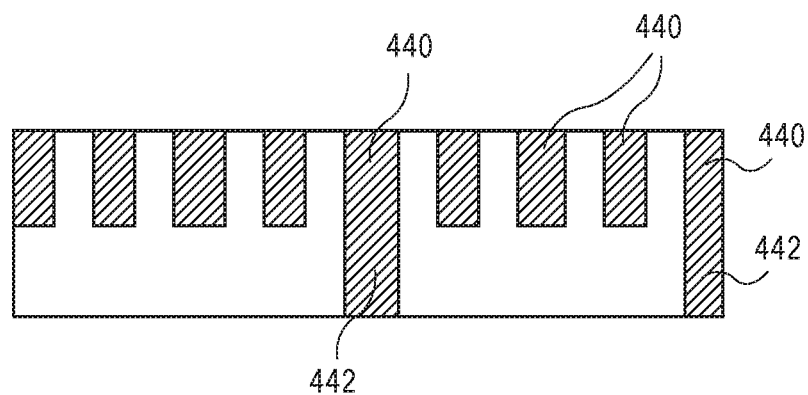

Referring to FIG. 4H, subsequent processing can include removal of spacers 408 and hardmask layer 404, and metal fill of metal line trenches 426 and via locations 424 to form conductive metal lines 440 and conductive vias 442, respectively. In one such embodiment, metallization is formed by a metal fill and polish back process. The structure of FIG. 4H may subsequently be used as a foundation for forming subsequent metal line/via and ILD layers. Alternatively, the structure of FIG. 4H may represent the final metal interconnect layer in an integrated circuit. It is to be appreciated that the above process operations may be practiced in alternative sequences, not every operation need be performed and/or additional process operations may be performed. Referring again to FIG. 4H, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Additionally, it is to be appreciated that the approaches described in association with FIGS. 4A-4H are not necessarily performed as forming vias aligned to an underlying metallization layer. As such, in some contexts, these process schemes could be viewed as involving blind shooting in the top down direction with respect to any underlying metallization layers. In a second aspect, a subtractive approach provides alignment with an underlying metallization layer. As an example, FIGS. 5A-5I illustrate portions of integrated circuit layers representing various operations in a method of subtractive self-aligned via patterning using photobuckets including a two-stage bake photoresist with a releasable quencher, in accordance with another embodiment of the present invention. In each illustration at each described operation, an angled three-dimensional cross-section view is provided.

Figure 5A:
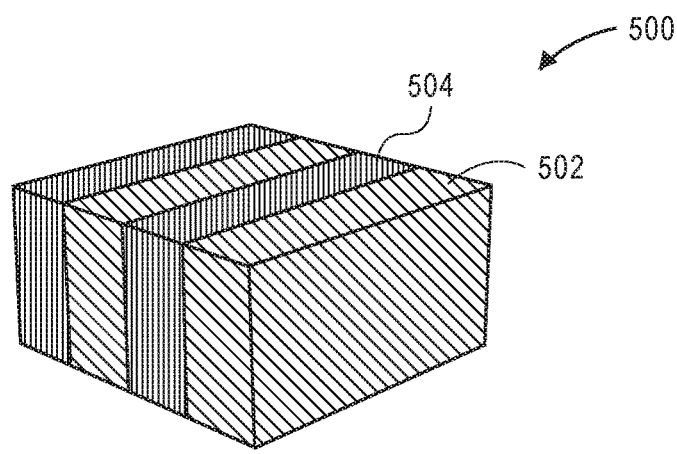
FIGS. 5A-5I illustrate portions of integrated circuit layers representing various operations in a method of subtractive self-aligned via patterning using photobuckets, in accordance with another embodiment of the present invention; where.

FIG. 5A illustrates a starting point structure 500 for a subtractive via process following deep metal line fabrication, in accordance with an embodiment of the present invention. Referring to FIG. 5A, structure 500 includes metal lines 502 with intervening interlayer dielectric (ILD) lines 504. It is to be appreciated that some of the lines 502 may be associated with underlying vias for coupling to a previous interconnect layer. In an embodiment, the metal lines 502 are formed by patterning trenches into an ILD material (e.g., the ILD material of lines 504). The trenches are then filled by metal and, if needed, planarized to the top of the ILD lines 504. In an embodiment, the metal trench and fill process involves high aspect ratio features. For example, in one embodiment, the aspect ratio of metal line height (h) to metal line width (w) is approximately in the range of 5-10.

Figure 5B:
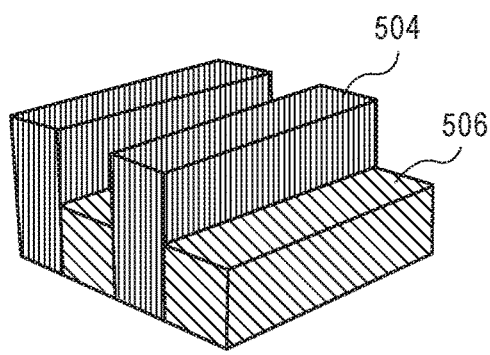

FIG. 5B illustrates the structure of FIG. 5A following recessing of the metal lines, in accordance with an embodiment of the present invention. Referring to FIG. 5B, the metal lines 502 are recessed selectively to provide first level metal lines 506. The recessing is performed selectively to the ILD lines 504. The recessing may be performed by etching through dry etch, wet etch, or a combination thereof. The extent of recessing may be determined by the targeted thickness of the first level metal lines 506 for use as suitable conductive interconnect lines within a back end of line (BEOL) interconnect structure.

Figure 5C:
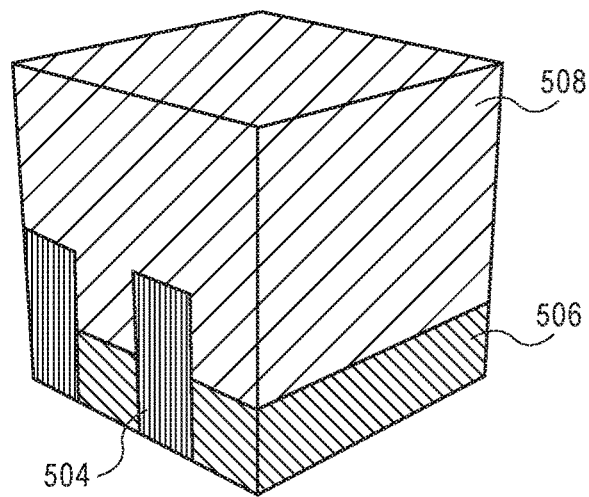

FIG. 5C illustrates the structure of FIG. 5B following formation of an inter layer dielectric (ILD) layer, in accordance with an embodiment of the present invention. Referring to FIG. 5C, an ILD material layer 508 is deposited and, if necessary, planarized, to a level above the recessed metal lines 506 and the ILD lines 504.

Figure 5D:
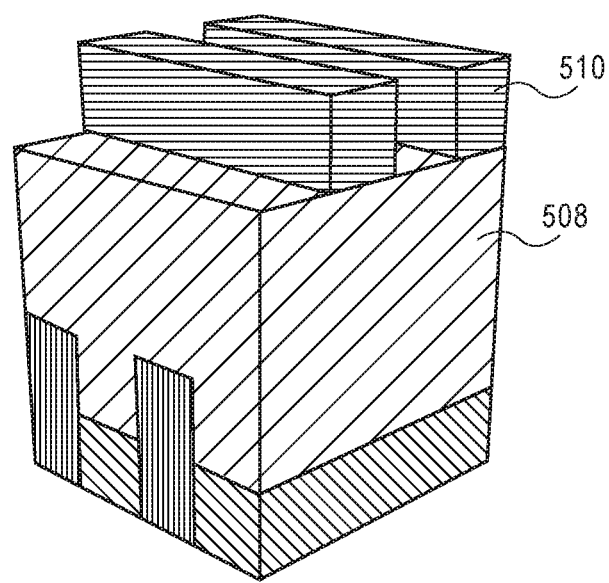

FIG. 5D illustrates the structure of FIG. 5C following deposition and patterning of a hardmask layer, in accordance with an embodiment of the present invention. Referring to FIG. 5D a hardmask layer 510 is formed on the ILD layer 508. In one such embodiment, the hardmask layer 510 is formed with a grating pattern orthogonal to the grating pattern of the first level metal lines 506/ILD lines 504, as is depicted in FIG. 5D. In an embodiment, the grating structure formed by the hardmask layer 510 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 510 of FIG. 5D may have hardmask lines spaced at a constant pitch and having a constant width.

Figure 5E:
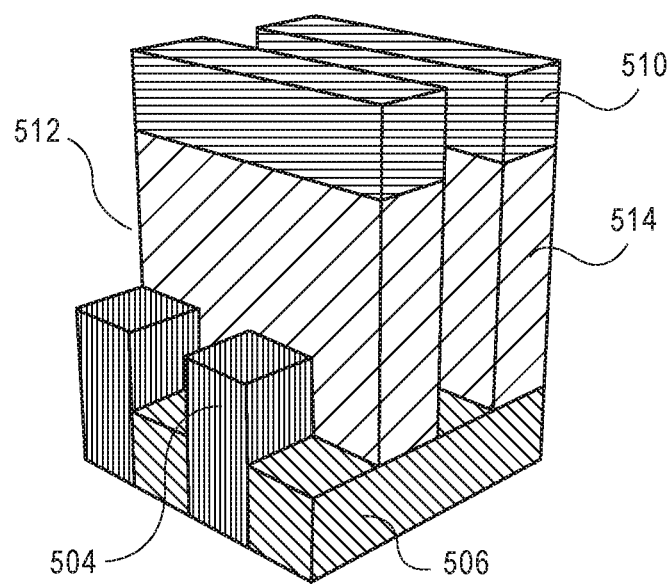

FIG. 5E illustrates the structure of FIG. 5D following trench formation defined using the pattern of the hardmask of FIG. 5D. In accordance with an embodiment of the present invention. Referring to FIG. 5E, the exposed regions (i.e., unprotected by 510) of the ILD layer 508 are etched to form trenches 512 and patterned ILD layer 514. The etch stops on, and thus exposes, the top surfaces of the first level metal lines 506 and the ILD lines 504.

Figure 5F:
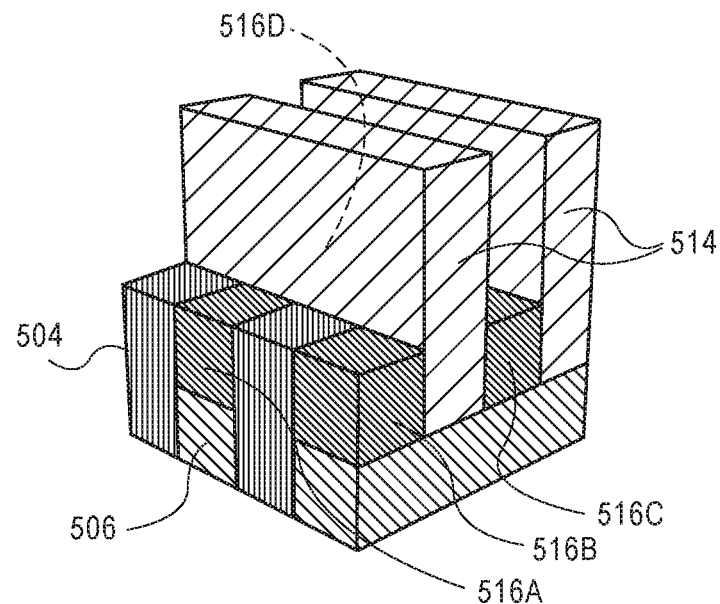

FIG. 5F illustrates the structure of FIG. 5E following photobucket formation in all possible via locations, in accordance with an embodiment of the present invention. Referring to FIG. 5F, photobuckets 516 are formed in all possible via locations above exposed portions of the recessed metal lines 506. In one embodiment, the photobuckets 516 are formed essentially co-planar with the top surfaces of the ILD lines 504, as depicted in FIG. 5F. Additionally, referring again to FIG. 5F, the hardmask layer 510 may be removed from the patterned ILD layer 514.

Referring again to FIG. 5F, in an embodiment, the photobuckets 516 include a material based on a two-stage bake photoresist with a releasable quencher, example of which are described above. Three different possible via locations 516A, 516B and 516C can be seen in the view provided in FIG. 5F.

Figure 5G:
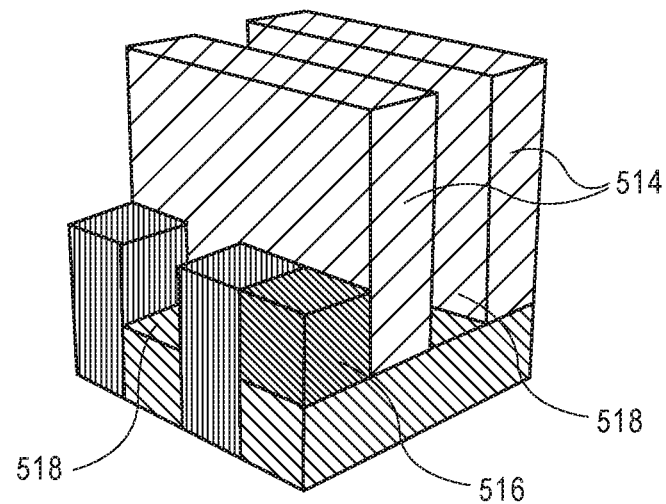

FIG. 5G illustrates the structure of FIG. 3F following via location selection, in accordance with an embodiment of the present invention. Referring to FIG. 5G, the photobuckets 516 from FIG. 5F in select via locations 518 are removed (i.e., photobuckets 516A and 516C are removed), in locations where vias are not selected to be formed, the photobuckets 316 are retained (i.e., photobucket 516B remains after the development process) In one embodiment, photobucket 516B is partially exposed during exposure of photobuckets 516A and 516C. However, as described above, since the photobucket 516B is only partially exposed and is not a select via location, the two-stage bake photoresist with a releasable quencher approach enables retention of all of photobucket 516B.

Figure 5H:
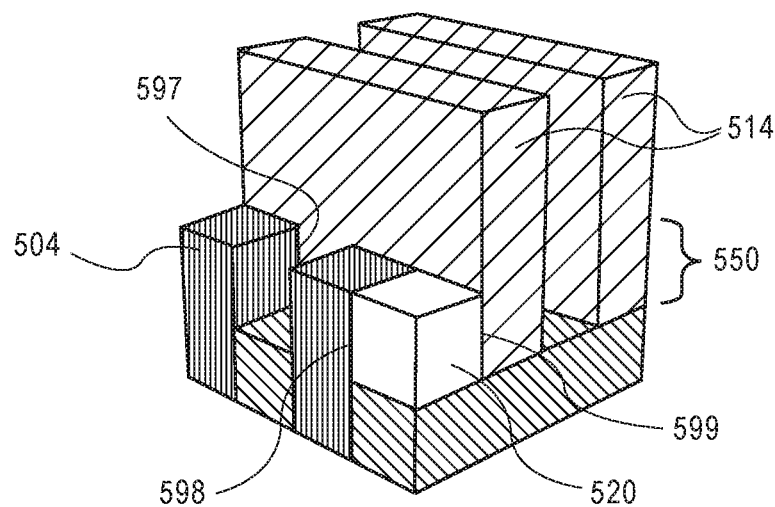

FIG. 5H illustrates the structure of FIG. 5G following conversion of the remaining photobuckets to permanent ILD material, in accordance with an embodiment of the present invention. Referring to FIG. 5H, the material of the photobuckets 516 is modified, e.g., by cross-linking upon a baking operation, in the locations to form a final ILD material 520. In one such embodiment, the cross-linking provides for a solubility switch upon the baking. The final, cross-linked material has inter-dielectric properties and, thus, can be retained in a final metallization structure. However, in other embodiments, the photobucket material of photobucket 516B is not converted to an ILD material and is instead ultimately removed and replaced with a permanent ILD material.

Referring again to FIG. 5H in an embodiment, the resulting structure includes up to three different dielectric material regions (ILD lines 504+ILD lines 514+cross-linked photobucket 520, in one embodiment) in a single plane 550 of the metallization structure. In one such embodiment, two or all of ILD lines 504, ILD lines 514, and cross-linked photobucket 520 are composed of a same material. In another such embodiment, ILD lines 504, ILD lines 514, and cross-linked photobucket 520 are all composed of different ILD materials. In either case, in a specific embodiment, a distinction such as a vertical seam between the materials of ILD lines 504 and ILD lines 514 (e.g., seam 597) and/or between ILD lines 504 and cross-linked photobucket 520 (e.g., seam 598) and/or between ILD lines 514 and cross-linked photobucket 520 (e.g., seam 599) may be observed in the final structure.

Figure 5I:
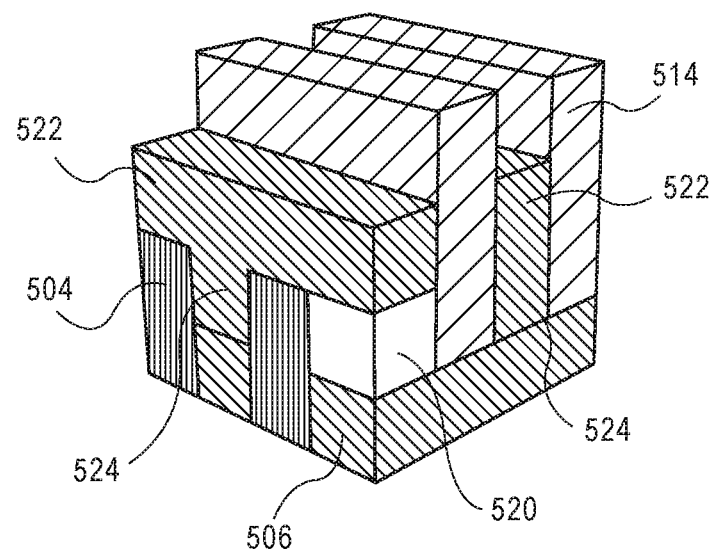

FIG. 5I illustrates the structure of FIG. 5H following metal line and via formation, in accordance with an embodiment of the present invention. Referring to FIG. 5I, metal lines 522 and vias 524 are formed upon metal fill of the openings of FIG. 5H. The metal lines 522 are coupled to the underlying metal lines 506 by the vias 524. In an embodiment, the openings are filled in a damascene approach or a bottom-up fill approach to provide the structure shown in FIG. 5I. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 514 may be removed to provide air gaps between the resulting metal lines 524.

The structure of FIG. 5I may subsequently be used as a foundation for forming subsequent metal line/via and ILD layers. Alternatively, the structure of FIG. 5I may represent the final metal interconnect layer in an integrated circuit. It is to be understood that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithograph/dual damascene patterning that must otherwise be tolerated, is not a factor for the resulting structures described herein. Referring again to FIG. 5I, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

Overall, in accordance with one or more embodiments of the present invention, approaches described herein involve use of photobucket interlayer dielectric (ILD) to select locations for plugs and vias. The details above regarding FIGS. 4A-4H and 5A-5I focus primarily on photobuckets including two-stage bake photoresist with a releasable quencher as used for via patterning. However, it is to be appreciated that photobuckets including a two-stage bake photoresist with a releasable quencher may also be used for plug patterning.

In an embodiment, the term "grating structure" for metal lines, ILD lines or hardmask lines is used to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described above may have metal lines, ILD lines or hardmask lines spaced at a constant pitch and having a constant width. The pattern may be fabricated by a pitch halving or pitch quartering approach.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material (e.g., metal lines and/or vias) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, plug and/or cap and/or hardmask materials are composed of dielectric materials different from the interlayer dielectric material. In one embodiment, these materials are sacrificial, while interlayer dielectric materials are preserved at least somewhat in a final structure. In some embodiments, a plug and/or cap and/or hardmask material includes a layer of a nitride of silicon (e.g., silicon nitride) or a layer of an oxide of silicon, or both, or a combination thereof. Other suitable materials may include carbon-based materials. In another embodiment, a plug and/or cap and/or hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other plug and/or cap and/or hardmask material layers known in the arts may be used depending upon the particular implementation. The plug and/or cap and/or hardmask material layers maybe formed by CVD, PVD, or by other deposition methods.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
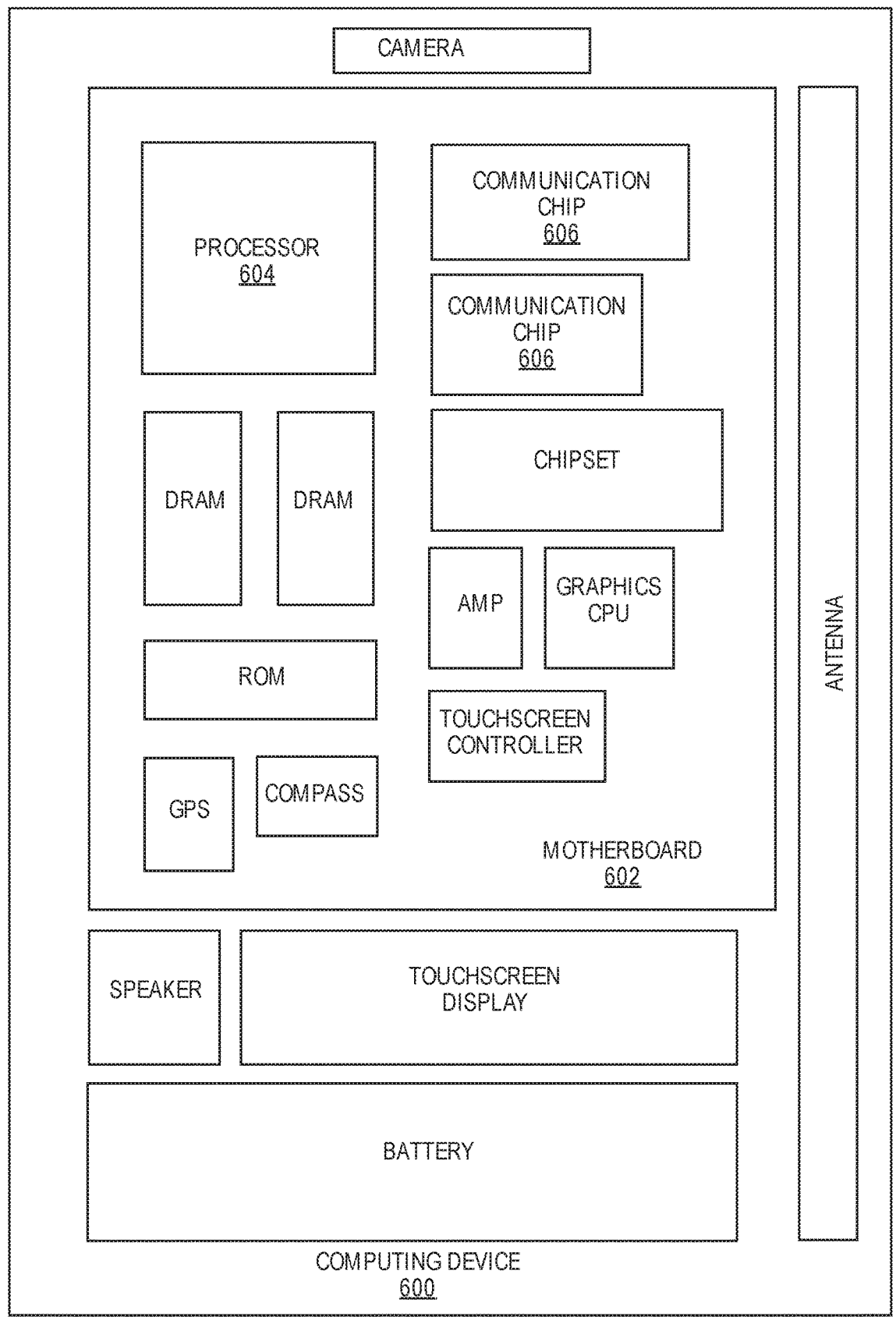
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more structures, such as self-aligned vias, built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more structures, such as conductive vias fabricated using a two-stage bake photoresist with a releasable quencher, in accordance with embodiments of the invention.

In further implementations, another component housed within the computing device 600 may contain an integrated circuit die that includes one or more structures, such as conductive vias fabricated using a two-stage bake photoresist with a releasable quencher, in accordance with embodiments of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
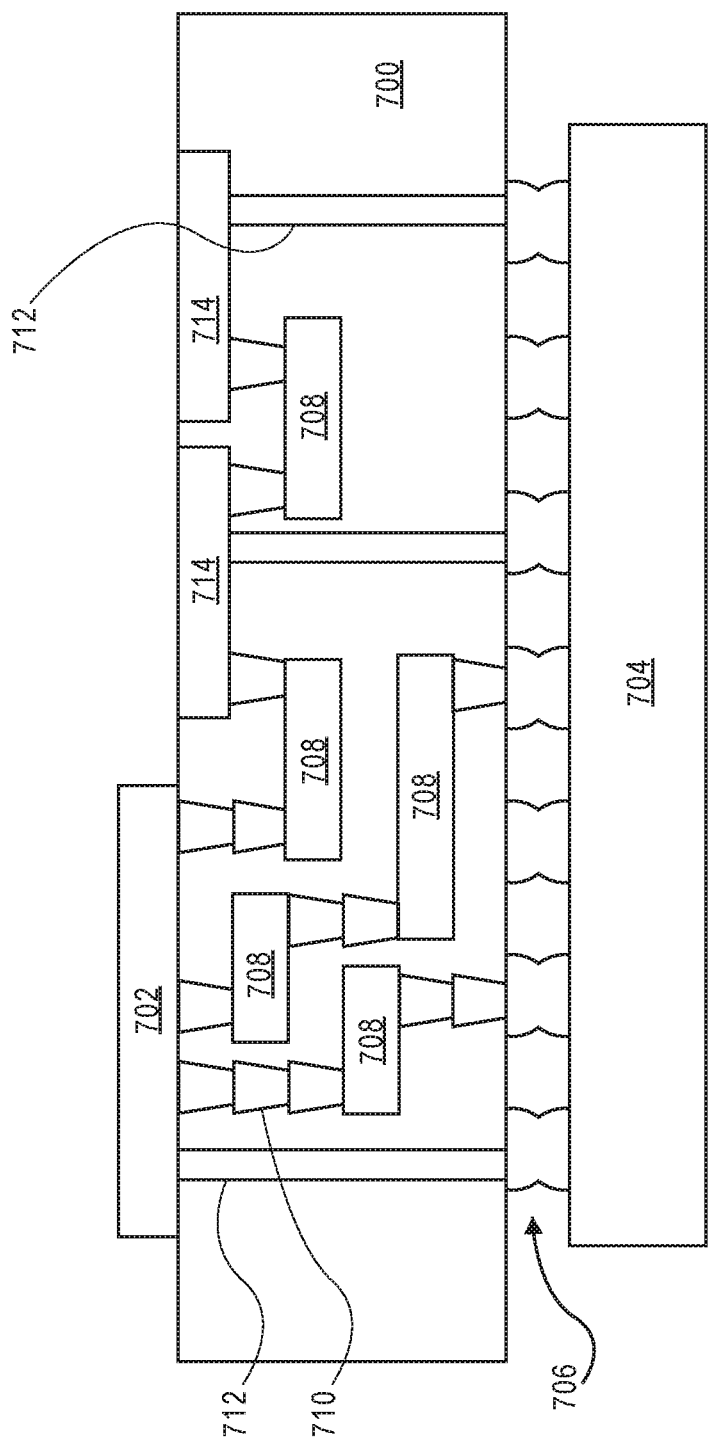
FIG. 7 is an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors and MEMS devices may also be formed on the interposer 700. In accordance with embodiments of the invention, apparatuses or processes disclosed herein may be used in the fabrication of interposer 700 or in one or more of the components of the interposer 700.

Thus, embodiments of the present invention include two-stage bake photoresists with releasable quenchers for fabricating back end of line (BEOL) interconnects.

In an embodiment, a photolyzable composition includes an acid-deprotectable photoresist material having substantial transparency at a wavelength, a photo-acid-generating (PAG) component having substantial transparency at the wavelength, and a base-generating component having substantial absorptivity at the wavelength.

In one embodiment, the base-generating component is one selected from the group consisting of a photo-base-generating component, an electron-base-generating component, a chemical-base-generating component, and a UV-base-generating component.

In one embodiment, the base-generating component includes a low-energy UV chromophore selected from the group consisting of anthracenylcarbamates, naphthalenyl-carbamates, 2-nitrophenylcarbamates, arylcarbamates, coumarins, phenylglyoxylic acid, substituted acetophenones and benzophenones.

In one embodiment, the base-generating component includes a material selected from the group consisting of N,N-dicyclohexyl-2-nitrophenylcarbamate, N,N-disubstituted carbamates and mono-substituted carbamates.

In one embodiment, the PAG component includes a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate.

In one embodiment, the acid-deprotectable photoresist material is an acid-deprotectable material selected from the group consisting of a polymer, a molecular glass, a carbosilane and a metal oxide.

In one embodiment, the acid-deprotectable photoresist material includes a material selected from the group consisting of a polyhydroxystyrene, a polymethacrylate, small molecular weight molecular glass versions of a polyhydroxystyrene or a polymethactylate which contain ester functionality sensitive to acid-catalyzed deprotection to carboxylic acid, a carbosilane, and a metal oxide possessing functionality sensitive to acid catalyzed deprotection or cross-linking.

In one embodiment, the wavelength is approximately 365 nm.

In one embodiment, the acid-deprotectable photoresist material is substantially absorbing at a wavelength of approximately 13.5 nanometers.

In one embodiment, the acid-deprotectable photoresist material is substantially absorbing at an energy approximately in the range of 5-150 keV.

In one embodiment, a molar ratio of the PAG component to the base-generating component is at least 50:1.

In an embodiment, a method of selecting a photobucket for semiconductor processing includes providing a structure having a first photobucket neighboring a second photobucket. The method further includes exposing the structure to extreme ultraviolet (EUV) or e-beam radiation, where the first photobucket is exposed to the EUV or e-beam radiation to a greater extent than the second photobucket. The method further includes, subsequent to exposing the structure to EUV or e-beam radiation, performing a first bake of the first and second photobuckets. The method further includes, subsequent to performing the first bake, exposing the structure to ultraviolet (UV) radiation, where the first photobucket is exposed to the UV radiation to approximately the same extent as the second photobucket. The method further includes, subsequent to exposing the structure to UV radiation, performing a second bake of the first and second photobuckets. The method further includes, subsequent to performing the second bake, developing the structure, where the developing opens the first photobucket and leaves the second photobucket closed.

In one embodiment, exposing the structure to extreme ultraviolet (EUV) or e-beam radiation includes exposing the structure to energy having a wavelength approximately 13.5 nanometers.

In one embodiment, exposing the structure to extreme ultraviolet (EUV) or e-beam radiation includes exposing the structure to energy in the range of 5-150 keV.

In one embodiment, exposing the structure to UV radiation includes exposing the structure to energy having a wavelength approximately 365 nanometers.

In one embodiment, the first bake is performed at a temperature approximately in the range of 50-120 degrees Celsius for a duration of approximately in the range of 0.5-5 minutes.

In one embodiment, the second bake is performed at a temperature approximately in the range of 100-180 degrees Celsius for a duration of approximately in the range of 0.5-5 minutes.

In one embodiment, the first and second photobuckets each includes a photolyzable composition including an acid-deprotectable photoresist material, a photo-acid-generating (PAG) component, and a photo-base-generating component.

In one embodiment, exposing the structure to extreme ultraviolet (EUV) or e-beam radiation includes activating the PAG component, where the first bake diffuses acid formed from activating the PAG component throughout the first and second photobuckets, where exposing the structure to UV radiation includes activating the photo-base-generating component, and where the second bake quenches a total amount of acid formed in the second photobucket with base generated from the photo-base-generating component but does not quench a total amount of acid formed in the first photobucket.

In one embodiment, the first and second photobuckets each includes a grafted photo-base-generating component along a bottom and sidewalls of the first and second photobuckets and a photolyzable composition formed within the grafted photo-base-generating component, the photolyzable composition including an acid-deprotectable photoresist material and a photo-acid-generating (PAG) component.

In one embodiment, exposing the structure to extreme ultraviolet (EUV) or e-beam radiation includes activating the PAG component, where the first bake diffuses acid formed from activating the PAG component throughout the first and second photobuckets, where exposing the structure to UV radiation includes activating the grafted photo-base-generating component, and where the second bake quenches a total amount of acid formed in the second photobucket with base generated from the photo-base-generating component but does not quench a total amount of acid formed in the first photobucket.

In one embodiment, the first and second photobuckets each includes a photolyzable composition including an acid-deprotectable photoresist material and a photo-acid-generating (PAG) component, and the method further includes, subsequent to performing the first bake and prior to exposing the structure to ultraviolet (UV) radiation, forming a layer including a base-generating component on the first and second photobuckets.

In one embodiment, exposing the structure to extreme ultraviolet (EUV) or e-beam radiation includes activating the PAG component, where the first bake diffuses acid formed from activating the PAG component throughout the first and second photobuckets, where exposing the structure to UV radiation includes activating the base-generating component, and where the second bake quenches a total amount of acid formed in the second photobucket with base generated from the base-generating component but does not quench a total amount of acid formed in the first photobucket.

In an embodiment, a photolyzable composition includes an acid-deprotectable photoresist material having substantial transparency at 365 nm, a photo-acid-generating (PAG) component having substantial transparency at 365 nm, and a photo-base-generating component having substantial absorptivity at 365 nm. A molar ratio of the PAG component to the photo-base-generating component is at least 50:1.

In one embodiment, the acid-deprotectable photoresist material is substantially absorbing at a wavelength of approximately 13.5 nanometers or is substantially absorbing at an energy approximately in the range of 5-150 keV.

What is claimed is:

1. A photolyzable composition, comprising:
    an acid-deprotectable photoresist material having substantial transparency at a wavelength, wherein the acid-deprotectable photoresist material is an acid-deprotectable material selected from the group consisting of a molecular glass, a carbosilane and a metal oxide;
    a photo-acid-generating (PAG) component having substantial transparency at the wavelength; and
    a base-generating component having substantial absorptivity at the wavelength, wherein the base-generating component comprises N,N-dicyclohexyl-2-nitrophenylcarbamate.

2. The photolyzable composition of claim 1, wherein the PAG component comprises a material selected from the group consisting of triethyl, trimethyl and other trialkylsulfonates, where the sulfonate group is selected from the group consisting of trifluoromethylsulfonate, nonanfluorobutanesulfonate, and p-tolylsulfonate.

3. The photolyzable composition of claim 1, wherein the acid-deprotectable photoresist material comprises a material selected from the group consisting of a polyhydroxystyrene, a polymethacrylate, small molecular weight molecular glass versions of a polyhydroxystyrene or a polymethacrylate which contain ester functionality sensitive to acid-catalyzed deprotection to carboxylic acid, a carbosilane, and a metal oxide possessing functionality sensitive to acid catalyzed deprotection or cross-linking.

4. The photolyzable composition of claim 1, wherein the wavelength is approximately 365 nm.

5. The photolyzable composition of claim 1, wherein the acid-deprotectable photoresist material is substantially absorbing at a wavelength of approximately 13.5 nanometers.

6. The photolyzable composition of claim 1, wherein the acid-deprotectable photoresist material is substantially absorbing at an energy approximately in the range of 5-150 keV.

7. The photolyzable composition of claim 1, wherein a molar ratio of the PAG component to the base-generating component is at least 50:1.

8. A photolyzable composition, comprising:
    an acid-deprotectable photoresist material having substantial transparency at 365 nm, wherein the acid-deprotectable photoresist material is an acid-deprotectable material selected from the group consisting of a molecular glass, a carbosilane and a metal oxide;

a photo-acid-generating (PAG) component having substantial transparency at 365 nm; and a photo-base-generating component having substantial absorptivity at 365 nm, wherein a molar ratio of the PAG component to the photo-base-generating component is at least 50:1, and wherein the base-generating component comprises N,N-dicyclohexyl-2-nitrophenylcarbamate.

9. The photolyzable composition of claim 8, wherein the acid-deprotectable photoresist material is substantially absorbing at a wavelength of approximately 13.5 nanometers or is substantially absorbing at an energy approximately in the range of 5-150 keV.

10. A photolyzable composition, comprising:
a photoresist material having substantial transparency at a wavelength, wherein the photoresist material comprises an acid-deprotectable metal oxide material;
a photo-acid-generating (PAG) component having substantial transparency at the wavelength; and
a base-generating component having substantial absorptivity at the wavelength.

11. The photolyzable composition of claim 10, wherein the base-generating component comprises N,N-dicyclohexyl-2-nitrophenylcarbamate.

* * * * *